June 22, 1971 P. V. GRAY 3,586,549

METHOD OF PRODUCING DIFFUSED JUNCTIONS IN PLANAR SEMICONDUCTIVE DEVICES

Original Filed Aug. 2, 1965

Inventor: Peter V. Gray, by Edward D. Murphy

His Attorney.

3,586,549
METHOD OF PRODUCING DIFFUSED JUNCTIONS IN PLANAR SEMICONDUCTIVE DEVICES

Peter V. Gray, Scotia, N.Y., assignor to General Electric Company

Original application Aug. 2, 1965, Ser. No. 476,512, now Patent No. 3,514,346, dated May 26, 1970. Divided and this application Aug. 8, 1969, Ser. No. 862,573
Int. Cl. H01l 7/34, 7/50
U.S. Cl. 148—187 5 Claims

ABSTRACT OF THE DISCLOSURE

In the fabrication of diffused planar semiconductive devices, junctions having reduced radius of curvatures are produced by etching the surface of the semiconductor after etching away of a diffusion mask and prior to activator into the semiconductor. Resultant devices have higher breakdown voltages and lower leakage currents.

This application is a division of my application Ser. No. 476,512, filed Aug. 2, 1965, entitled "Method of Producing Diffused Semiconductive Devices and Product Thereof," now U.S. Pat. No. 3,514,346.

The present invention relates to improved planar semiconductive devices which embody p-n junctions prepared by impurity diffusion, and to a method of producing such devices.

Planar junction devices are of particular importance in the general field of semiconductors, principally because of their substantially lower cost. While transistors and diodes made by other methods must be produced individually or in relatively small groups, simultaneous operations on planar wafers can produce thousands of planar junction devices which are then readily separated for encapsulation and use. Accordingly, the cost of production is widely distributed and minimized.

Due to the reduced cost, it is desirable to increase the range of applications in which such devices can be substituted for individually prepared devices. The expansion of this range of substitution has been severely limited, however, by the limited performance range of planar junction devices. If the requirements of a particular application are relatively high, planar devices cannot be used and the cost of the particular component may be increased by a factor of 100 or more. A particular difficulty which has limited the performance of previous planar junction devices have been the failure of p-n junctions therein to properly isolate the respective regions of different conductivity type. As the voltage across the junction increases in the reverse direction, leakage occurs through the junction and breakdown occurs at a relatively low level. Accordingly, it is of significant importance to provide planar devices which are not subject to these difficulties.

It is therefore an object of this invention to provide an improved method of preparing planar junction devices which results in junctions having isolation characteristics substantially improved over those previously obtainable.

It is also an object of this invention to provide an improved method of preparing planar devices having junctions in which the leakage under reverse bias is reduced and in which the reverse breakdown voltage is substantially increased.

Another object of this invention is the provision of planar junction devices having isolation characteristics substantially improved over those previously obtainable.

A further object of this invention is the provision of improved planar junction devices which are not subject to leakage at relatively low levels of reverse bias and in which the reverse breakdown voltage is substantially increased.

Briefly, in accord with one embodiment, my invention lies in an improvement in the method of preparing diffused junctions in planar semiconductive devices which includes the steps of providing a monocrystalline semiconductive body of selected conductivity type, producing a passivating layer on the surface of the semiconductor, removing a portion of said layer and diffusing an impurity into one region of the semiconductor to cause the conversion thereof to opposite conductivity type and to produce a p-n junction between the one region and the adjacent region of the body. In accord with my invention, I provide the additional step of etching the surface-adjacent region of the semiconductor after removal of the passivation layer and before the step of impurity diffusion. The etching is carried on to remove a depth of material sufficient to reduce or eliminate irregularities in the boundary between the semiconductor surface and the passivation layer so that the radius of curvature of a diffused junction thereafter produced in the semiconductor is greater than the width of the space charge region of the junction. In accord with a separate feature of this invention, the etching may be allowed to proceed to remove a sufficient depth so that the radius of curvature of a diffused junction thereafter produced in the semiconductor is substantially greater than the depth of the diffused region.

In accord with another embodiment of my invention, I provide planar semiconductive devices having diffused junctions therein, the radius of curvature of which is always greater than the thickness of the space charge region and which may be, in accord with a further feature, greater than the diffusion depth.

The novel features believed characteristic of the invention are set forth in the appended claims. The invention itself, together with further objects and advantages thereof may best be understood by reference to the following description taken in connection with the appended drawings in which:

The problems of leakage and low voltage breakdown associated with planar devices having diffused junctions are well known. I have discovered that these problems arise principally from two causes. FIGS. 1–5 illustrate the manner in which one of these causes occurs and the correction thereof in accord with my invention. The illustration of FIG. 1 comprises a monocrystalline semiconductive body 1 which may, for example, be silicon or another material suitable for the production of planar devices therein. The body 1 is provided with a conductivity type selected according to the desired electrical configuration of the final device. For example, in silicon, impurities such as phosphorus, boron or other donors or acceptors may be added in concentrations ranging from $10^{15}$ to $10^{20}$ atoms per cubic centimeter to provide, respectively, n- or p-type conductivity. It is noted that this illustration is greatly enlarged since the provision of two junction regions is contemplated in the illustration, whereas in practice, one thousand or more may actually be produced in a wafer one inch in diameter.

A layer 2 of passivating material is usually provided which covers a planar surface 3 of the semiconductor body although this is not necessary in the present invention. The term "passivation" generally includes the functions of insulating the semiconductor electrically and of protecting the surface from environmental contamination. Thus the layer 2 may comprise any material which adequately performs these functions. The thickness of the layer may vary depending on the particular requirements of the final device as well as the diffusion process during which it must mask the underlying semiconductor. In general, this layer is between 0.1 and 2 microns thick.

Figure 1:
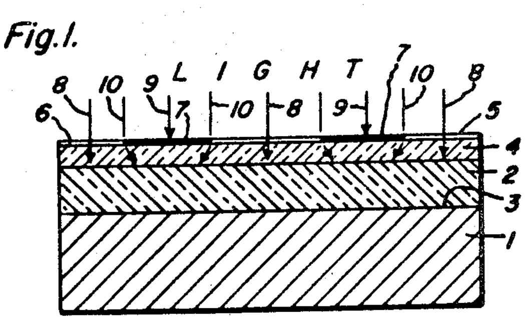
FIG. 1 is a vertical cross-sectional view of a semiconductive wafer at an intermediate stage in the process of producing a planar device therein.

A layer 4 comprises photoresist material of the type which undergoes a change in response to exposure to light such that either exposed or unexposed portions may be removed without disturbing the other portion. For example, the photoresist material sold by the Eastman Kodak Company, Inc., under the trademark "KPR" is suitable. Layer 4 is customarily about 0.5 micron thick. In accord with conventional photolithographic processes, a mask 5 having transparent areas 6 and opaque areas 7 is placed over the surface of the photoresist material so as to cover the portions which are not to be exposed to light. For example, in the case of the "KPR" photoresist material, the areas of the semiconductor surface 3 into which diffusion is to be performed to produce junctions therein are masked from the light as illustrated in FIG. 1. Finally, the mask is exposed to light from a broad area source (not shown).

As illustrated in FIG. 1, light approaching and passing through the mask in the center of transparent areas 6 is substantially unaffected thereby as illustrated by the continuous arrows 8. Light which encounters opaque areas 7 is completely blocked out as shown by arrows 9 and does not reach the photoresist layer 4. However, as indicated by the arrows 10, light which passes very close to an edge of the opaque area 7 is diffracted so that a portion thereof is turned into the region of photoresist adjacent the edge of opaque areas. Therefore, over a region extending on both sides of the edge of the opaque areas, the light which should be concentrated in a small area is distributed and the entire region is insufficiently exposed. The portion under the opaque areas has received some light and the unmasked portion immediately adjacent has received less light than it should. Accordingly, when the mask 5 is removed and photoresist solvent is applied to layer 4, some of the partially exposed material may be removed with the unexposed portion while some of it may remain with the exposed portion. This effect is random, depending on the amount of light diffracted and also on the severity of vibration caused by handling during the application of solvent.

Figure 2:
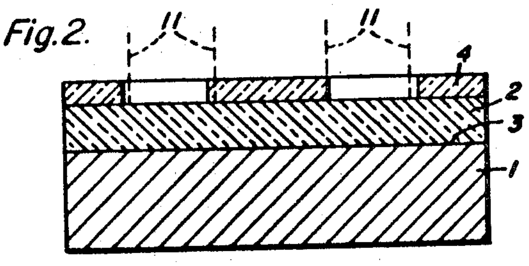
FIG. 2 is a vertical cross-sectional view of the same wafer at a later stage in the process.
Figure 3:
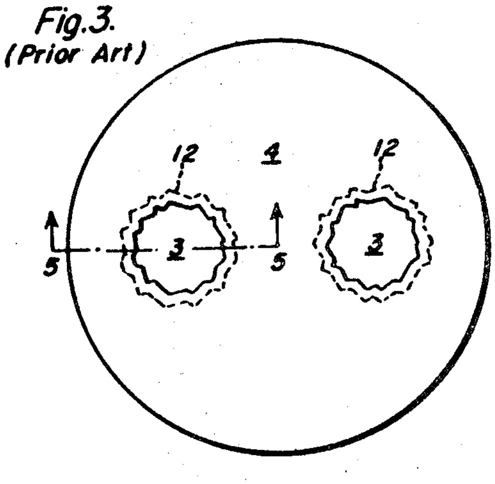
Fig.3. (Prior Art)
FIG. 3 is a plan view of a semiconductive wafer embodying junctions produced in accordance with the prior art process.

Since these factors cannot be controlled, the boundary of the uncovered passivation layer is also random. This is shown in FIG. 2 by the difference between the size of the regions from which photoresist layer 5 has been removed and the desired size defined by the opaque areas 7, represented by dotted lines 11. This effect is better shown by the top view of FIG. 3 wherein the apertures in layer 4 are shown to have jagged, irregular boundaries.

The next step is the removal of the uncovered passivation layer underlying opaque areas 7 to expose corresponding regions of the semiconductor surface 3. This may be done by applying a suitable etchant which removes the passivation layer without disturbing the photoresist layer. For example, $NH_4F:HF$ in water may be used to remove an oxide of silicon without affecting the layer of "KPR" photoresist. Since the boundaries defined by the photoresist layer are irregular, the boundaries of the passivation layer removed are correspondingly irregular. Finally, in known processes, the body is placed in an atmosphere containing an impurity which, when diffused into the exposed semiconductor surface in sufficient quantity, changes the conductivity type so as to produce a junction within the body. Since the semiconductor surface through which the impurity is diffused has an irregular boundary, the irregularities are repeated in the areas of the diffused impurity. That is, where an excess amount of semiconductor surface is exposed the diffusion of the impurity is found to be deeper within the body and where an excess of passivating layer remains, the diffusion of the impurity is less. Accordingly, the portion of the junction within the device which extends from the circumference of the portion underlying the opening and parallel with the surface to the surface repeats the irregularities originated in the photoresist layer as illustrated by the dotted line 12 in FIG. 3. Of course, this is also true if the passivation layer is omitted.

Within an asymmetrically conductive junction, a region exists in which there are no free carriers which is defined as the space charge region. It is produced by the interaction of carriers within the junction and the width is defined by the electric field produced by ions in the material. Free carriers lie along the boundary of this region. If a sharp corner exists within the junction so that a space charge region is doubled back upon itself, a build-up of carriers occurs at the corner. This causes a voltage gradient substantially in excess of this existing in the remainder of the junction when a reverse bias is applied. Accordingly, leakage occurs at the corner much sooner than it would in the remainder of the junction and the junction breaks down at this corner at a much lower level of reverse bias voltage. I have found that the irregularities produced in the junction by the above described process are sufficiently sharp to cause these problems. Therefore the utility of planar devices is significantly reduced since breakdown occurs at a low level. Even before breakdown, high leakage is produced by the high gradient.

In accord with my invention, I have discovered that these difficulties can be substantially reduced or eliminated by removing semiconductive material from under the irregular boundary of the passivation layer so that the diffusion of the impurity produces a smooth junction. In other words, I have found that if a suitable etchant is applied to remove a sufficient depth of semiconductive material, the action of the etchant reduces or eliminates irregularities at the boundary between the semiconductor and the passivation layer. The subsequent impurity diffusion then proceeds into a smoothly bounded surface, the circumferential portion of the junction is smooth and difficulties of leakage and breakdown are avoided.

Figure 4:
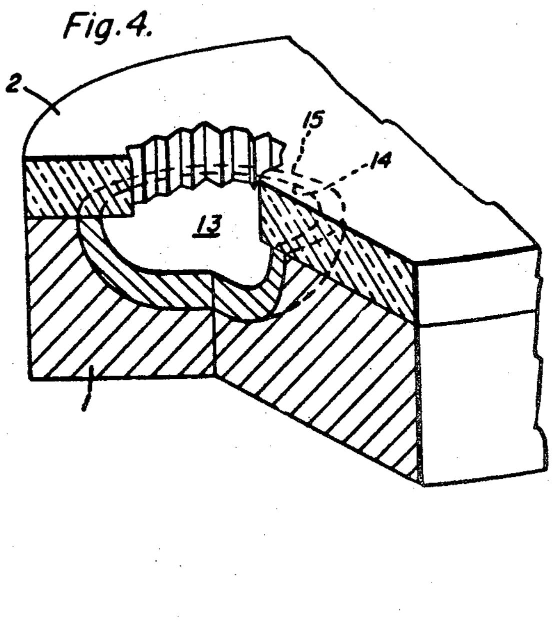
FIG. 4 is a perspective view, partially broken away, of a semiconductive wafer including a junction produced in accordance with the present invention.

The effect of the etching step provided by this invention is shown in FIG. 4. The passivation layer 2 has an irregular boundary produced by light diffraction and random removal of photoresist material as described above. The additional step of etching, however, has produced a cavity 13 within the semiconductive body 1 and the etchant has reduced the irregularities so that the intersection of the boundary of the exposed semiconductive material with the passivation layer 2, illustrated by dotted line 14, is smooth. Therefore, the impurity diffusion into the exposed surface of the semiconductor initiates in a surface having a smooth boundary and, since the rate of diffusion is constant throughout the material, the junction produced, illustrated by the dotted line 15, is correspondingly smooth.

In precise terms, I have found that if the radius of curvature of a junction in a given region is comparable with or smaller than the width of the space charge region, then the carrier concentration previously mentioned occurs, causing a magnification of the voltage gradient in that region. Leakage and low level breakdown occur when a reverse bias is applied to the junction. The irregularities introduced into such junctions by the correspondence of the diffusion pattern to the irregularity in the photoresist material have radii of curvature less than the thickness of the space charge region and therefore cause these problems.

In accord with the present invention, I have found that the application of an etchant to the exposed semiconductive material to remove a sufficient depth of material so that the radius of curvature of the circumferential portion of the junction is always greater than the thickness of the space charge region substantially reduces the problems of leakage and low level breakdown. This is due to the progression of the etching in the semiconductive material. At first, since the etchant contacts an area of semiconductor corresponding to the opening in the passivation layer, the etchant reproduces the irregularities in the semiconductor. However, once a surface-adjacent region of semiconductor has been removed, the etchant attacks the material under the passivation layer and begions to expand the cavity in the plane of the semiconductor surface. At this point, the convex irregularities are removed more quickly than the regular portions of the boundary since the etchant attacks the sides of the convexity as well as the front. At the same time, concave irregularities are not removed as quickly since the point is less exposed to the etchant. Therefore the effect, as the etching progreses, is to reduce the irregularities and produce a cavity having a smooth boundary with the passivation layer.

In general, semiconductive material should be etched to a depth sufficient to substantially remove the described irregularities. In general, the removal of a depth of material in a range of from 0.1 to 10 microns, measured in a direction perpendicular to the planar surface is sufficient to reduce the irregularities due to the described light diffraction. It is noted that the small contours that still exist may be removed by further etching; however, as the radii of curvature of the contours becomes large, the improvement becomes negligible. As to the lower limit, a noticeable increase in the radius of curvature of the irregularities can be obtained by etching as little as 0.1 micron. It is, of course, preferred that the etch be continued for the few additional seconds necessary so that the radius of curvature of local irregulraities in the junction is greater than the thickness of the space charge region and preferably is at least twice this thickness to obtain the full benefit of this invention.

Figure 5:
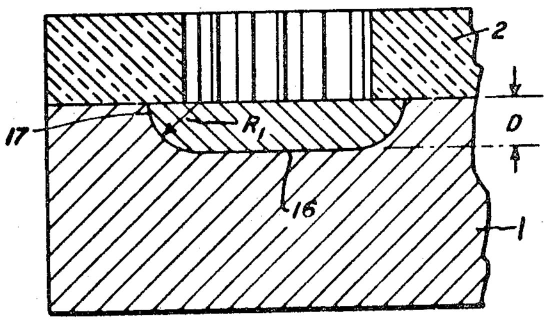
Fig.5. (Prior Art)
FIG. 5 is a vertical cross-sectional view of a semiconductive wafer including a junction produced in accordance with the prior art process.

Also in accord with my invention, I have discovered that a second source of breakdown and leakage in planar diffused junctions is the formation of a corner between the planar portion underlying and parallel to the exposed semiconductor surface and the portion extending from the circumference thereof to the surface underlying the passivation layer which has a radius of curvature on the order of the thickness of the diffusion depth. This is illustrated in FIG. 5 wherein the planar portion of the junction 16 meets the circumferential portion 17 in an intersection of radius $R_1$ which is on the order of the diffusion depth D.

Figure 6:
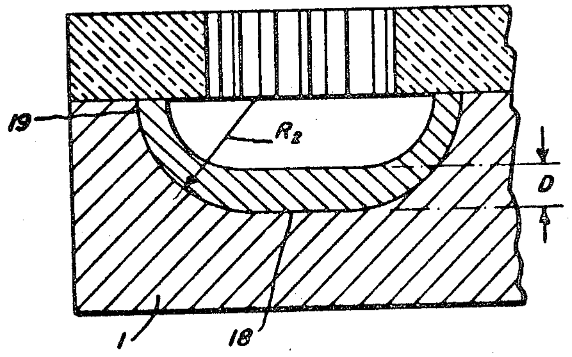
FIG. 6 is a vertical cross-sectional view of a semiconductive wafer including a junction produced in accordance with the present invention.

I have discovered that the etching previously described increases the radius of curvature of the junction and thereby avoids this problem. That is, the radius of curvature of the junction is approximately equal to the depth of the etch plus the depth of diffusion. This is shown in FIG. 6 wherein the corner between the planar portion 18 of the junction and the perpendicular portion 19 has a radius of curvature $R_2$ which is substantially greater than the diffusion depth D. Since the depth of diffusion is determined by the desired electrical characteristics of the device, the required depth of the etched cavity can be determined by subtraction. In general, the radius of curvature of the junction corner should be substantially greater than the diffusion depth and is preferably equal to or greater than twice the diffusion depth. Therefore, the depth of mateiral etched should at least approach the intended depth of diffusion to remove this further source of breakdown.

It is noted that the present invention is applicable to any of the various junctions produced in semiconductive devices, regardless of the presence of previously formed junctions or the prospect of further junctions to be produced after that in question. Also, this invention is not limited to the formation p-n junctions but is also applicable to the prdouction of junctions with other regions such as intrinsic conductivity region, as in a p-i-n device, or more heavily doped regions, as in a p-n-n+ device.

Figure 7:
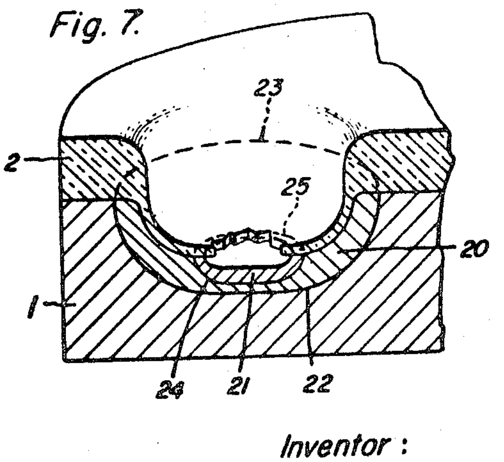
FIG. 7 is a vertically cross-sectioned perspective view of a multi-junction device produced in accord with the present invention.

A three-layer transistor fabricated in accord with the present invention is illustrated in FIG. 7. As shown, the device comprises a semiconductive body 1 and a passivation layer 2. Within the body 1, regions 20 and 21 are of differing conductivity so as to produce two asymmetrically conducting junctions, for example, as in a p-n-p transistor. The region 21 is contained with the region 20 and both regions extend to the surface of the semiconductive body. The circumferential portion of the junction 22 formed between region 20 and body 1, illustrated by the dotted line 23, is made smooth by utilizing the above described process. Junction 24 between region 21 and region 20 may be made smooth, if desired, as indicated by dotted line 25 by fabricating junction 24 by the above described process. However, since the junction 24 functions as an emitter junction, it is not, in practice, reverse biased and therefore need not be protected against breakdown. It is also noted that, since junction 22 is formed by diffusion to a relatively great depth, the etching described above need not be as great at in the case of a shallower junction. In any event, it is preferred that the semiconductor body be etched as above described prior to the formation of junction 22 to reduce any irregularities which may appear therein so that the radius of curvature of the circumferential portion is greater than the space charge width of the junction. Since the junction 24 is relatively shallow, the etching if done, should be as described above to reduce the irregularities.

To further exemplify the present invention and the advantages thereof, the following table is set forth which compares the results obtained from tests of diodes prepared in two halves cut from a single silicon wafer. This comparison is typical of the results usually obtained. The two halves were treated identically, except that the additional step of etching in accord with the present invention was performed on one half but not on the other. The etch depth was 2.0 microns while the diffusion depth, in both halves, was 0.9 micron. All of the resulting diodes could be classified into three categories. Those which exhibited high reverse breakdown voltages, in excess of 24 volts, and little or no leakage current at lower reverse voltages were classified "good." Those which exhibited lower breakdown voltages, on the order of 20–24 volts, and higher leakage current at lower voltages were classified "intermediate." The remaining diodes leaked so severely as to breakdown at very low reverse voltages on the order of 0–5 volts were classified "bad."

TABLE I

| Wafer half | Number of diodes: Good | Intermediate | Bad | Total |
|---|---|---|---|---|
| Etched | 13 | 13 | 1 | 27 |
| Not etched | 3 | 8 | 10 | 21 |

Clearly, a substantial increase in the quality of the diodes produced in the respective halves was obtained by etching these wafers in accord with the present invention.

The following examples are set forth to exemplify the practice of this invention. These examples include specifiic values of the parameters involved so that the invention may be practiced by those skilled in the art. It is noted however, that these examples are provided for purposes of illustration only and are not to be construed in a limiting sense.

EXAMPLE 1

A wafer of silicon doped with boron to provide p-type conductivity and having a resistivity of 1 ohm-centimeter is provided with an oxide coating 1 micron thick. A layer of "KPR" photoresist material approximately 0.5 micron thick is provided on the oxide coating of the wafer. A mask comprising a transparent member having opaque spots therein according to the pattern of junctions which are to be provided in the silicon wafer is placed on the photoresist layer and the surface is exposed, through the mask, to collimated light from a carbon arc source to expose the photoresist material. The mask is removed and the wafer is dipped in a photoresist developer solution which removes the unexposed photoresist material. The developer may be stirred to speed the removal. The wafer may then be heated to a temperature of 200° C. in dry nitrogen for one hour to harden the remaining photoresist material. The oxide region uncovered by the removal of photoresist is etched away by dipping the wafer in a solution of $HF:NH_4F$ in water in a ratio of 3:1:3 for approximately four minutes. The wafer is dipped in a solution of $HNO_3:HF$ in a ratio of 9:1 for 8.5 seconds to remove two microns of the silicon exposed by the removal of the oxide. The remaining photoresist material is removed by dipping in trichloroethylene. The wafer is placed in an atmosphere containing phosphorus and heated to a temperature of 1000° for one hour to produce phosphorus-doped n-type regions one micron deep adjacent the surface of the exposed silicon. The concentration of phosphorus at the surface is approximately $10^{19}$ atoms per cubic centimeter, thus converting the phosphorus doped regions to n-type conductivity and providing a plurality of n-p junctions within the wafer. Metallic contacts are attached to each of these diodes by aluminum deposition through appropriate masks and the wafer is scribed and broken to separate the various diodes. The diodes exhibit reduced leakage and increased reverse breakdown voltage as described above.

EXAMPLE 2

A wafer of germanium doped with gallium to a concentration of $10^{17}$ atoms per cubic centimeter to provide p-type conductivity and having a resistivity of 0.1 ohm-centimeter is provided with a coating of an oxide of silicon 1 micron thick. A layer of "KPR" photoresist material approximately 0.5 micron thick is provided on a planar surface. The mask comprising a transparent member having opaque spots therein according to the pattern of junctions which are to be provided in the germanium wafer is placed on the photoresist layer and the surface is exposed, through the mask, to a collimated light from a carbon arc source to expose the photoresist material. The mask is removed and the wafer is dipped in a photoresist developer solution which removes the unexposed photoresist material. The developer may be stirred to speed the removal. The wafer may then be heated to a temperature of 200° C. in dry nitrogen for one hour to harden the remaining photoresist material. The oxide regions uncovered by the removal of photoresist are etched away by dipping the wafer in a solution of $NF:NH_4F$ in water in a ratio of 3:1:3 for approximately four minutes. The wafer is then dipped in a solution of $HNO_3:HF$ in a ratio of 9:1 for 60 seconds to remove 1 micron of the germanium exposed by the removal of the oxide. The remaining photoresist material is removed by dipping the wafer in trichloroethylene. The wafer is placed in a sealed ampule containing arsenic and is heated to a temperature of 700° C. for 30 minutes to produce a plurality of doped n-type regions 1.0 micron deep adjacent the surface of the germanium. The concentration of arsenic at the surface is approximately $10^{19}$ atoms per cubic centimeter, thus converting the regions to p-type conductivity and providing a plurality of p-n junctions within the wafer. Metallic contacts are attached to each of these diodes by silver deposition through appropriate masks and the wafer is scribed and broken to separate the various diodes. The diodes exhibit reduced leakage and increased negative breakdown voltage as described above.

It is noted that, although the description and examples of the present invention set forth above have been stated as applied to silicon and germanium, it is applicable to the formation of a junction in any material by the described method since, in any such case, the irregularities described above would be introduced by the conventional process and would be overcome by the present invention. For example, in the case of a planar gallium arsenide device made by this process, the improvement residing in this invention can be achieved by etching the gallium arsenide either with the combination of nitric acid and hydrofluoroic acid previously used or, preferably with a 5 Normal solution of NaOH with a 10% by weight addition of a 30% by volume solution of $H_2O_2$ to remove the irregularities otherwise reproduced in a diffused junction therein.

It is also noted that the irregularities produced in the peripheral portion of the junction which extends from the circumference of the planar portion of the junction may also be reduced by etching a sufficient amount of the passivation layer from under the photoresist layer so as to reduce the irregularities as above described. This is done after the removal of the unexposed regions of photoresist and before diffusion of the impurity. In this case, the size of the photoresist region removed should be smaller so that, when the passivation layer is etched, the opening therein is of the desired size. If the etch is done into the passivation layer, it is preferably continued to a horizontal distance under the photoresist material sufficient to reduce the irregularities in the layer so that the peripheral portion of the junction has a radius of curvature greater than the space charge thickness of the junction. However, it is preferred that the additional step of etching in accord with the present invention performed in the semiconductive material as previously described to avoid premature removal of the exposed photoresist material and other difficulties.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. In the method of producing an asymmetrically conductive junction between regions of differing conductivity in a semiconductive body which includes the steps of providing a wafer comprising a semiconductive body of selected conductivity; forming a layer of photoresist material over a surface of said wafer; exposing said photoresist material to light of a predetermined pattern and removing said photoresist material from at least one region defined by said pattern to produce at least one opening through said layer, the boundary of said opening being irregular due to light diffraction in said photoresist material; and diffusing an impurity into said semiconductive body through said opening to change the conductivity of a surface-adjacent region and produce an asymmetrically conductive junction therein; the improvement comprising the additional step, performed between said removal of said photoresist material and said diffusion, of etching the material of said wafer exposed under said opening to reduce irregularities at the boundary of the exposed semiconductive material corresponding to those in said photoresist material so as to reduce irregularities otherwise produced in said junction.

2. In the method of producing an asymmetrically conductive junction between regions of differing conductivity in a semiconductive body which includes the steps of providing a wafer comprising a semiconductive body of selected conductivity; forming a layer of photoresist material over a surface of said wafer; exposing said photoresist material to light of a predetermined pattern and removing said photoresist material from at least one region defined by said pattern to produce at least one opening through said layer, the boundary of said opening being irregular due to light diffraction in said photoresist material; and diffusing an impurity into said semiconductive body through said opening to change the conductivity of a surface-adjacent region and produce an asymmetrically conductive junction therein; the improvement comprising the additional step, performed between said removal of said photoresist material and said diffusion, of etching the material of said wafer exposed under said opening to reduce irregularities at the boundary of the exposed semiconductive material corresponding to those in said photoresist material so as to reduce irregularities otherwise produced in said junction, said etching being continued to a depth sufficient to increase the radius of curvature of irregularities in said junction to a value greater than the thickness of the space charge region of said junction.

3. In the method of producing an asymmetrically conductive junction between regions of differing conductivity in a semiconductive body which includes the steps of providing a wafer comprising a semiconductive body of selected conductivity and having a passivation layer on a surface thereof; forming a layer of photoresist material over said passivation layer; exposing said photoresist material to light of a predetermined pattern and removing said photoresist material from regions defined by said pattern to produce openings through said layer, the boundaries of said openings being irregular due to light diffraction in said photoresist material; removing the passivation layer exposed by said removal of photoresist material; and diffusing an impurity into said semiconductive body through said openings to change the conductivity of a surface-adjacent region and produce an asymmetrically conductive junction therein; the improvement comprising the additional step, performed between said removal of said photoresist material and said diffusion, of etching said passivation layer adjacent said openings to reduce irregularities at the boundary of the exposed semiconductive material corresponding to those in said photoresist material so as to reduce irregularities otherwise produced in said junction, said etching being continued to a depth greater than 0.1 micron to increase the radius of curvature of irregularities in said junction to a value greater than the thickness of the space charge region of said junction.

4. In the method of producing an asymmetrically conductive junction between regions of differing conductivity in a semiconductive body which includes the steps of providing a wafer comprising a semiconductive body of selected conductivity; forming a layer of photoresist material over a surface of said wafer; exposing said photoresist material to light of a predetermined pattern and removing said photoresist material from regions defined by said pattern to produce openings through said layer, the boundaries of said openings being irregular due to light diffraction in said photoresist material; and diffusing an impurity into said semiconductive body through said openings to change the conductivity of a surface-adjacent region and produce an asymmetrically conductive junction therein; the improvement comprising the additional step, performed between said removal of said photoresist material and said diffusion, of etching the semiconductive material exposed under said openings to reduce irregularities in the boundary of the exposed semiconductive material corresponding to those in said photoresist material so as to reduce irregularities otherwise produced in said junction, said etching being continued to a depth greater than 0.1 micron to increase the radius of curvature of irregularities in said junction to a value greater than the thickness of the space charge region of said junction.

5. In the method of producing an asymmetrically conductive junction between regions of differing conductivity in a semiconductive body which includes the steps of providing a wafer comprising a semiconductive body of selected conductivity; forming a layer of photoresist material over a surface of said wafer; exposing said photoresist material to light of a predetermined pattern and removing said photoresist material from at least one region defined by said pattern to produce at least one opening though said layer, the boundary of said opening being irregular due to light diffraction in said photoresist material, and diffusing an impurity a predetermined depth into a surface of said semiconductive body through said opening to change the conductivity of a surface-adjacent region and produce an asymmetrically conductive junction therein having a flat portion underlying said opening and a side portion extending to said surface; the improvement comprising the additional step, performed between said removal of said photoresist material and said diffusion, of etching the semiconductive material exposed under said opening to reduce irregularities in the boundary of the exposed semiconductive material corresponding to those in said photoresist material so as to reduce irregularities otherwise produced in said junction, said etching being continued to a depth on the order of said predetermined diffusion depth to increase the radius of curvature between said flat portion and said side portion to a value greater than said diffusion depth.

References Cited

UNITED STATES PATENTS

| | | | |
|---|---|---|---|
| 3,158,788 | 1/1964 | Last | 148—33 |
| 3,514,346 | 6/1970 | Cray | 148—33.5 |

L. DEWAYNE RUTLEDGE, Primary Examiner

R. A. LESTER, Assistant Examiner

U.S. Cl. X.R.

29—578